United States Patent [19]
Tamaki et al.

[11] Patent Number: 5,007,534
[45] Date of Patent: Apr. 16, 1991

[54] RETAINER FOR CHIP-TYPE ELECTRONIC PARTS

[75] Inventors: Kuniaki Tamaki; Norio Sakai; Kenji Minowa, all of Nagaokakyo, Japan

[73] Assignee: Murata Manufacturing Co., Ltd., Japan

[21] Appl. No.: 413,334

[22] Filed: Sep. 27, 1989

[30] Foreign Application Priority Data

Sep. 27, 1988 [JP] Japan .................................. 63-242988

[51] Int. Cl.$^5$ ............................................ B65D 73/00
[52] U.S. Cl. .................................................. 206/329
[58] Field of Search ............... 206/328, 329, 332, 562, 206/331

[56] References Cited

U.S. PATENT DOCUMENTS

| 2,518,450 | 8/1950 | Cowen et al. | 206/329 |
| 3,604,557 | 9/1971 | Cedrone | 206/331 X |
| 3,652,974 | 3/1972 | Tems | 206/331 X |
| 4,444,309 | 4/1984 | Morton, Jr. | 206/328 X |
| 4,598,821 | 7/1986 | LaBarbara et al. | 206/329 |

FOREIGN PATENT DOCUMENTS

| 066339 | 12/1982 | European Pat. Off. | 206/332 |
| 996991 | 6/1965 | United Kingdom . | |
| 1404876 | 9/1975 | United Kingdom . | |
| 2144390A | 3/1985 | United Kingdom . | |
| 84/03653 | 9/1984 | World Int. Prop. O. . | |

Primary Examiner—William I. Price
Attorney, Agent, or Firm—Ostrolenk, Faber, Gerb & Soffen

[57] ABSTRACT

A retainer for chip-type electronic parts comprising an elastic retainer plate formed of elastic material and having a plurality of retaining holes formed therein for retaining chip-type electronic parts. The elastic retainer plate is arranged such that chip-type electronic parts are elastically held by elastic holding power applied by inner surfaces of the retaining holes.

4 Claims, 3 Drawing Sheets

PRIOR ART

RETAINER FOR CHIP-TYPE ELECTRONIC PARTS

BACKGROUND OF THE INVENTION

1. Field of the Invention

The present invention relates generally to a retainer for chip-type electronic parts for temporarily holding chip-type electronic parts, and more particularly, to a retainer for electronic parts used, for example while measuring properties of chip-type electronic parts, placing markings on the surfaces of chip-type electronic parts, or containing many electronic parts in a housing in order to package the electronic parts in a tape-type packaging structure.

2. Description of Background Art

FIG. 1 is a partially-broken perspective view showing the foregoing type of retainer for chip-type electronic parts as conventionally used, and FIG. 2 is a cross sectional view showing main parts of the retainer shown in FIG. 1.

A conventional retainer 1 for electronic parts is constructed by using a rectangular plate 2 made of metal with a predetermined thickness. Many retaining holes 4 are formed in alignment, each holding a respective chip-type electronic part 3 such as a multilayer capacitor.

The plane shape of each of the retaining holes 4 is a shape corresponding to the plane shape of the electronic part 3. Each of the retaining holes 4 comprises a first opening 4a having a depth corresponding to the thickness of the electronic part 3 and a second opening 4b connected to the first opening 4a and having a diameter smaller than that of the first opening 4a. A stepped portion 4c on which both ends of the electronic part 3 are deposited interconnects the openings 4a and 4b.

The electronic part 3 is inserted in the first opening 4a in the retaining hole 4 in the direction represented by an arrow in FIG. 2.

When electrical properties of the electronic part 3 are measured and the electronic part 3 is subjected to marking, the electronic part 3 must be fixed in the retaining hole 4. Accordingly, when the conventional retainer 1 for electronic parts having the above-described structure is used, the electronic part 3 is held in the first opening 4a by applying suction by vacuum from below through the second opening 4b.

With the above-described holding method, however, when a clearance exists between an inner surface of the first opening 4a and a side surface of the electronic part 3, it is difficult to precisely position the electronic part 3 in the first opening 4a. Consequently, there is a problem that it is difficult to make measurements of, and to place markings on the parts with high precision.

The prior art retainer for electronic parts shown in the perspective view of FIG. 3 has been considered as being a solution to the above-described problem. In FIG. 3, portions corresponding to those in the structure shown in FIGS. 1 and 2 have the same reference numerals and hence, the description thereof is not repeated.

The retainer 5 for electronic parts shown in FIG. 3 is constructed by using a rectangular plate 6 made of metal. A plurality of elastic body-attaching holes 7 are formed in the plate 6. Elastic bodies 8 made of, for example, rubber are integrally adhered in the elastic body-attaching holes 7, respectively, by molding. Retaining holes 9 each having a diameter slightly smaller than that of the external form of an electronic part are respectively formed in the elastic bodies 8.

In the retainer 5 for electronic parts shown in FIG. 3, electronic parts are respectively held in the retaining holes 9. Consequently, the electronic parts can be subjected to processing such as marking.

In the retainer 5 for electronic parts, no clearance occurs between an inner surface of the retaining hole 9 and an external side surface of the electronic part so that the electronic part is held due to the elasticity of the elastic body 8. Accordingly, the electronic parts can be easily positioned.

In the retainer 5 for electronic parts shown in FIG. 3, the elastic holding power received from the inner surface of the retaining hole 9 depends on the size of the retaining hole 9 relative to the external form of the electronic part, that is, the wall thickness of the elastic body 8. For example, the elastic holding power is decreased when the wall thickness of the elastic body 8 is decreased so that the diameter of the retaining hole 9 becomes large, while being increased when the wall thickness of the elastic body 8 is large so that the diameter of the retaining hole 9 becomes small.

Accordingly, when the wall thickness of the elastic body 8 adhered to an inner surface of each of the elastic body attaching holes 7 in the plate 6 is formed with low precision, the electronic parts are likely to receive non-uniform elastic holding power from the inner surfaces of the retaining holes 9. More specifically, some electronic parts are held by relatively weak elastic holding power. As a result, difficulties are liable to arise in exactly positioning each of the electronic parts in the retaining hole 9 to measure its electronic properties, for subjecting each of the electronic parts to required processing such as marking or taping, and, further, for variously handling the parts when, for example, storing or shipping the retainer 5.

In order to eliminate the above described difficulties, it is necessary to increase the precision of the wall thickness of the elastic body 8. If this is done, however, the cost of manufacturing the elastic body 8 is high.

SUMMARY OF THE INVENTION

Accordingly, an object of the present invention is to provide a retainer for chip-type electric parts that is capable of holding a plurality of chip-type electronic parts by considerable and uniform elastic holding power while preventing the fabrication cost from rising and causing difficulty in handling the parts.

The retainer for chip-type electronic parts according to the present invention is characterized by comprising an elastic retainer plate having a plurality of retaining holes for chip-type electronic parts formed therein and being adapted such that chip-type electronic parts are elastically held by elastic holding power received from inner surfaces of the retaining holes for chip-type electronic parts. Only elastic materials forming the elastic retainer plate exist between the plurality of retaining holes formed in the elastic retainer plate. Accordingly, the electronic parts respectively held in the retaining holes receive substantially uniform elastic holding power from the inner surfaces of the retaining holes. As a result, a plurality of electronic parts can be held by considerable and uniform elastic holding power. In addition, it costs less to form the elastic retainer plate, so that the cost of the retainer can be reduced.

The retainer for chip-type electronic parts according to the present invention may further comprise a frame formed of rigid materials having an opening, with the above-described elastic retainer plate being fixed in the opening. In addition, the frame may have a plurality of openings. In this case, a respective elastic retainer plate as described above is fixed in each of the openings.

Furthermore, a method of holding chip-type electronic parts according to the present invention comprises the steps of preparing an elastic retainer plate having a plurality of retaining holes for chip-type electronic parts formed therein and containing chip-type electronic parts in the above-described retaining holes for chip-type electronic parts, respectively, thereby to elastically hold the chip-type electronic parts by elastic holding power received from inner surfaces of the retaining holes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
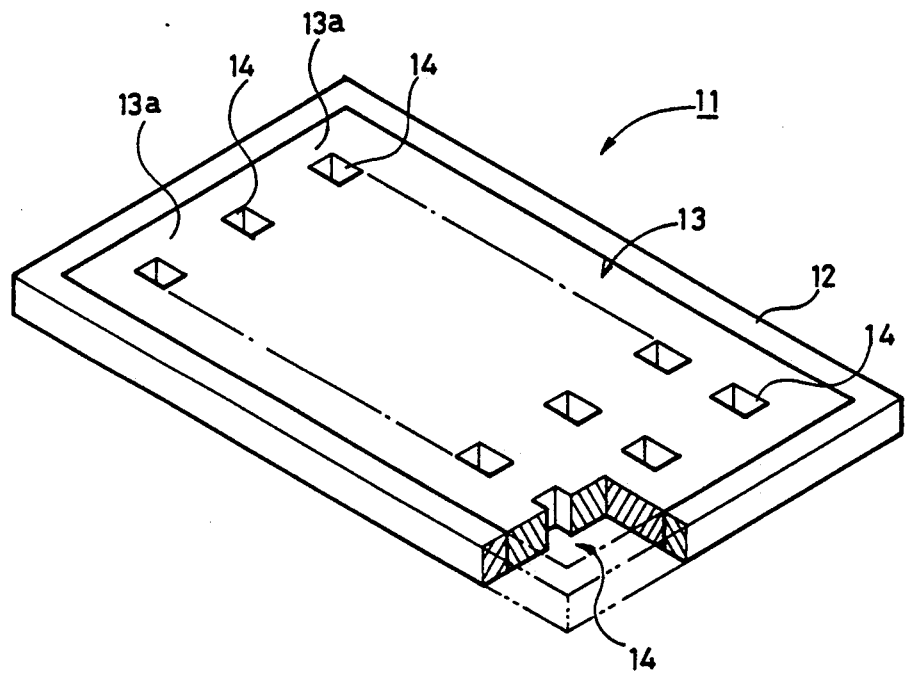
FIG. 4 is a partially-broken perspective view for explaining a retainer for electronic parts according to an embodiment of the present invention.

FIG. 4 is a partially-broken perspective view of a retainer for electronic parts according to an embodiment of the present invention. Referring to FIG. 4, a retainer 11 for chip-type electronic parts according to the present embodiment comprises a rectangular frame 12 made of rigid materials such as metal or ceramics and an elastic retainer plate 13 fixed in an opening of the frame 12. The elastic retainer plate 13 can be formed of rubber, synthetic resins having elasticity, or the like.

Figure 1:
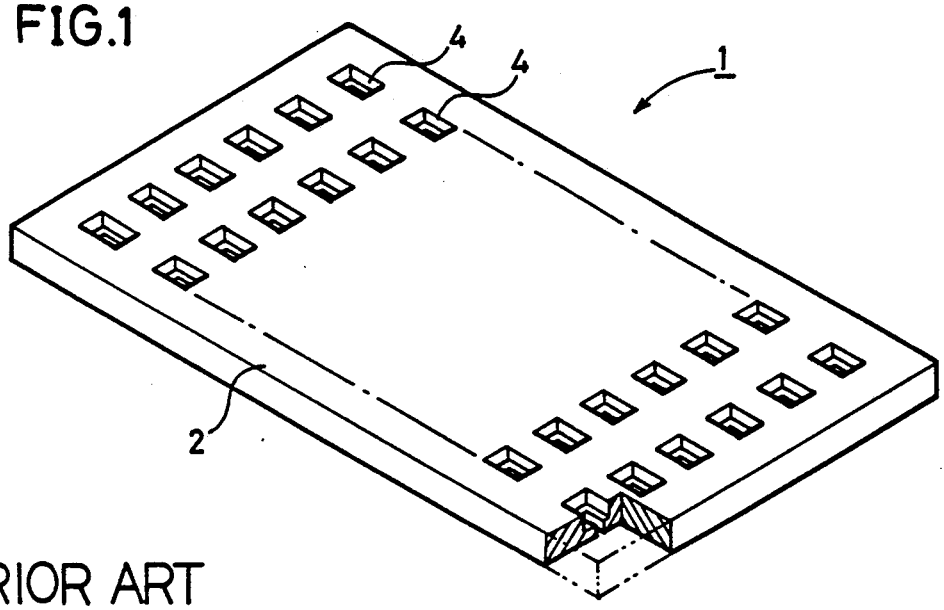
FIG. 1 is a partially-broken perspective view showing an example of a conventional retainer for electronic parts.
Figure 2:
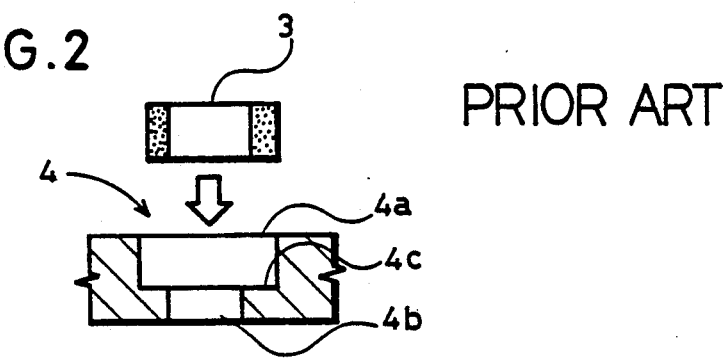
FIG. 2 is a cross-sectional view showing main parts of the retainer for electronic parts of FIG. 1 in an enlarged manner.

A plurality of retaining holes 14 each having a diameter slightly smaller than that of the external form of an electronic part to be held are formed in alignment in the elastic retainer plate 13. Each of the retaining holes 14 is a hole having the same diameter from the upper surface to the lower surface of the elastic retainer plate 13. Accordingly, the retaining holes 14 can be formed more simply, as compared with the retaining holes 4 shown in FIG. 1.

In the retainer 11 for chip-type electronic parts according to the present embodiment, only elastic body portions 13a constituting the elastic retainer plate 13 exist between the plurality of retaining holes 14 formed in the elastic retainer plate 13. Accordingly, when electronic parts are respectively contained in the retaining holes 14, the electronic parts can receive substantially uniform elastic holding power from inner surfaces of the retaining holes 14. More specifically, the conventional retainer 5 for electronic parts shown in FIG. 3 has the disadvantage in that there are variations in elastic holding power received by the electronic parts if the wall thicknesses of the elastic bodies 8 are not made uniform with high precision. On the other hand, in the structure according to the present embodiment, only the elastic body portions 13a exist between the retaining holes 14, so that the electronic parts can receive constant elastic holding power even if the precision of the wall thickness of each of the elastic body portions is not increased.

Furthermore, in handling the chip-type electronic parts, it is preferable to hold as many chip-type electronic parts as possible in the retainer to achieve quantity production. In the retainer 5 for electronic parts shown in FIG. 3, however, a part of the plate 6 made of metal must be interposed between the elastic bodies 8, so that there is a limit to how much the distance between the chip-type electronic parts can be decreased while increasing the wall thickness of each of the elastic bodies 8 to enhance the elastic holding power. As a result, it is difficult to increase the number of electronic parts held in a single retainer.

On the other hand, in the retainer 11 for electronic parts according to the present embodiment, the distance between the chip-type electronic parts, that is, the distance between the retaining holes 14, can be set more arbitrarily. Accordingly, the pitch or spacing of the contained electronic parts can be substantially decreased. Consequently, quantity production of the chip-type electronic parts can be enhanced, so that the cost thereof can be effectively reduced.

Figure 3:
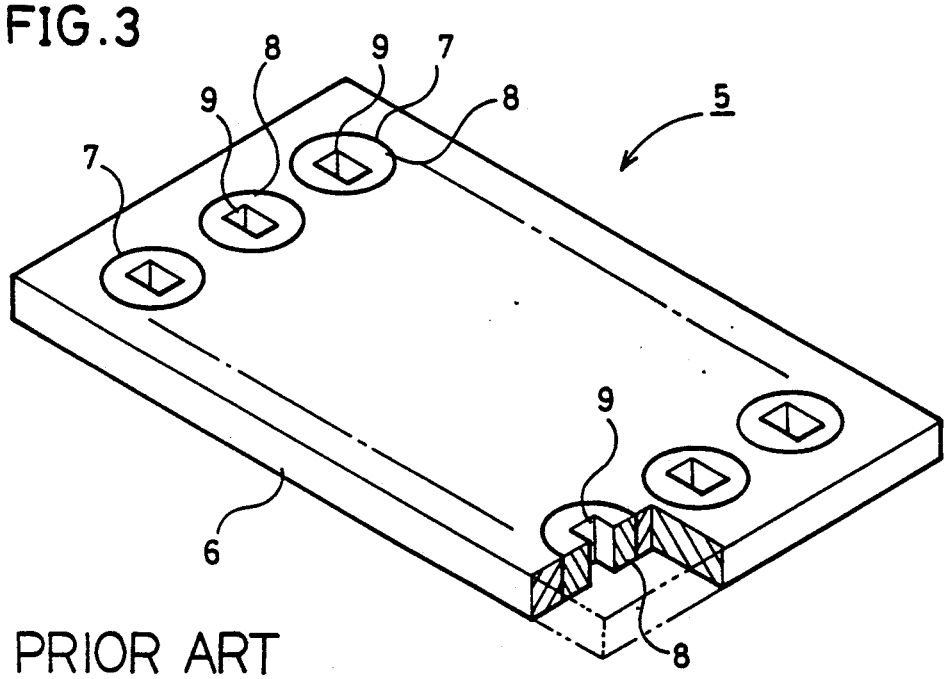
FIG. 3 is a partially-broken perspective view for explaining another example of the conventional retainer for electronic parts.

Additionally, in the retainer 5 for electronic parts shown in FIG. 3, when many chip-type electronic parts are to be held, the respective attaching holes 7 must be made small. As a result, the wall thickness of each of the elastic bodies 8 is decreased, so that the distance between each of the chip-type electronic parts held and the plate 6 is decreased. Accordingly, in specifying electrical properties of the electronic part, stray capacitance is produced between the electronic part and the plate 6. Consequently, it is difficult to measure the electrical properties with high precision.

On the other hand, in the retainer 11 for electronic parts according to the present embodiment, no member formed of a metal plate is interposed between the retaining holes 14. Accordingly, even if more chip-type electronic parts are held, there occurs no variation in measuring precision due to stray capacitance.

Figure 6:
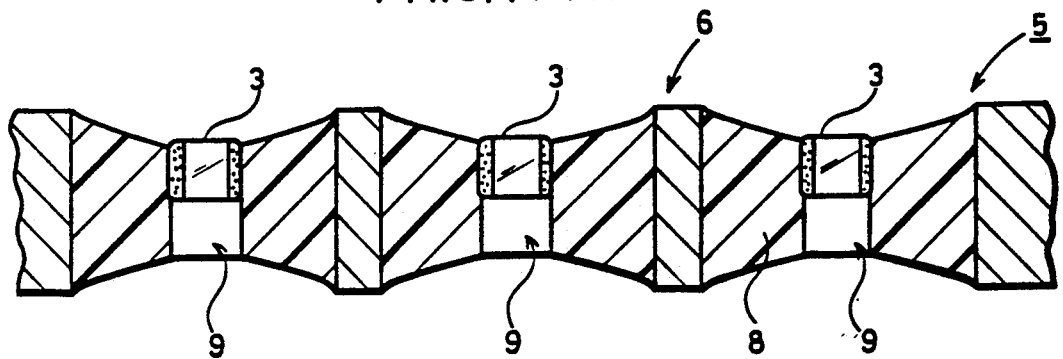
FIG. 6 is a cross sectional view for explaining the problems of the conventional retainer for electronic parts.

Furthermore, as shown in detail in FIG. 6, in the retainer 5 for electronic parts shown in FIG. 3, when the elastic bodies 8 are formed of synthetic resins, the uper ends of the openings of the retaining holes 9 are liable to be lower than the upper surface of the metal plate 6 because of shrinkage of the elastic bodies 8 during the hardening of the resins. As a result, sloping portions are formed on each elastic body 8. Consequently, when markings are placed on the surfaces of the electronic parts 3, for example, such markings may, in some cases, be hard to interpret.

Figure 7:
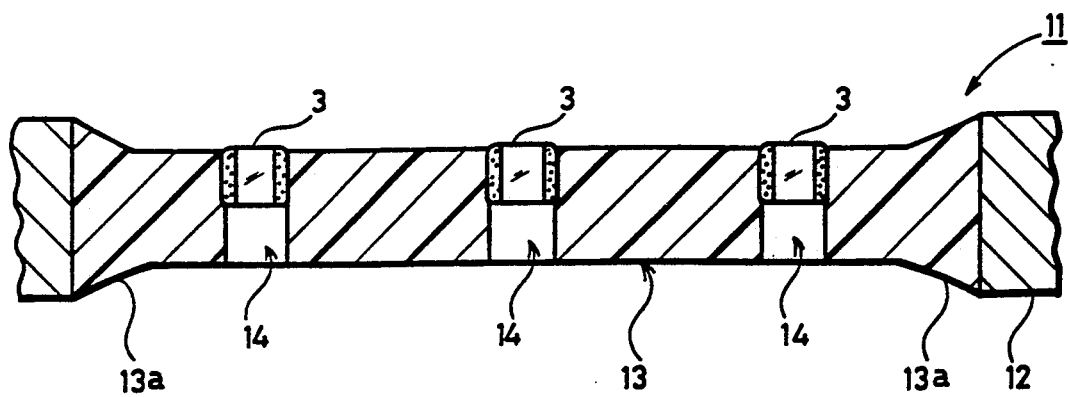
FIG. 7 is a partial cross-sectional and broken view for explaining the effect of the retainer for electronic parts according to an embodiment of the present invention, showing a state corresponding to that shown in FIG. 6.

On the other hand, in the retainer 11 for electronic parts according to the present embodiment, when the elastic retainer plate 13 is similarly formed of synthetic resins, sloped portions as described above are formed only in the vicinity of ends 13a of the elastic retainer plate 13, as shown in a cross-sectional view in FIG. 7, even if the elastic retainer plate 13 shrinks because of the hardening of the resins. More specifically, no sloping or stepped portion is formed between the retaining holes 14. Accordingly, markings can be placed with high precision and reliably by screen process printing or the like. For ease of illustration, the stepped portions are shown in an exaggerated manner in FIGS. 6 and 7.

Figure 5:
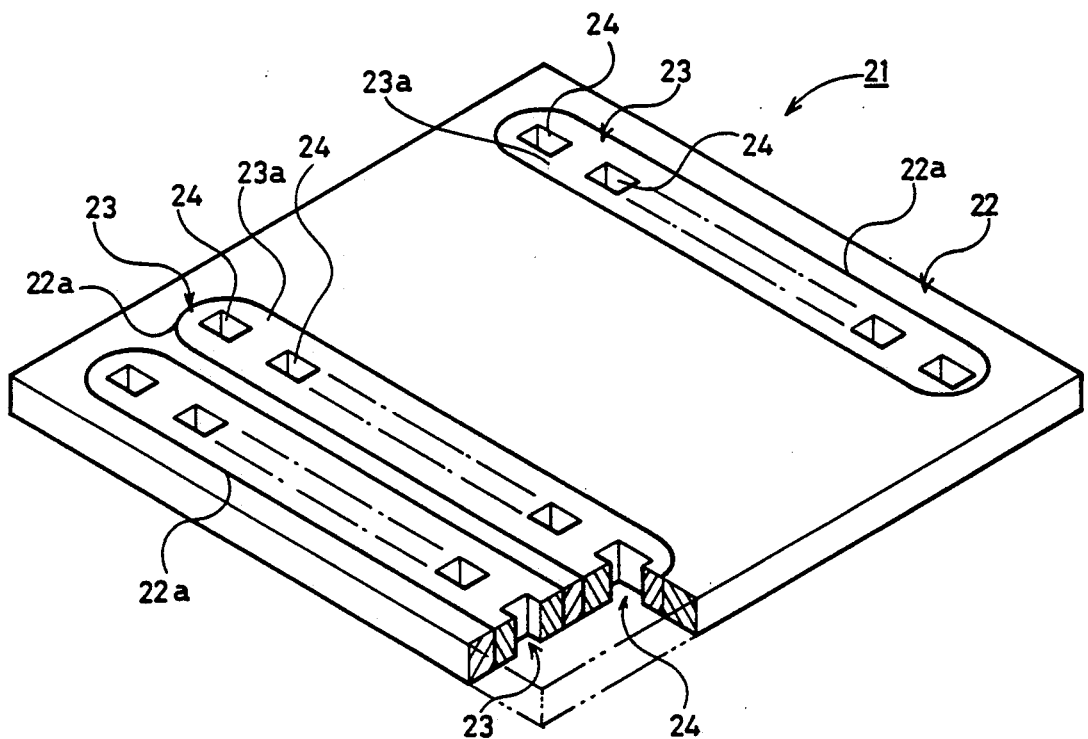
FIG. 5 is a partially-broken perspective view for explaining a retainer for electronic parts according to another embodiment of the present invention.

FIG. 5 is a partially-broken perspective view showing a retainer for electronic parts according to another embodiment of the present invention. In a retainer 21 for electronic parts according to the present embodiment, a plurality of openings 22a are formed in a frame 22. Elastic retainer plates 23 are respectively fixed in the openings 22a. A plurality of retaining holes 24 are aligned in each of the elastic retainer plates 23, as in the elastic retainer plate 13.

As described in the foregoing, according to the present invention, the plurality of elastic retainer plates 23 may be fixed in a single frame 22. Also in the retainer 21 for chip-type electronic parts shown in FIG. 5, only portions 23a of the elastic retainer plate 23 exist between the plurality of retaining holes 24. Accordingly, the retainer 21 for chip-type electronic parts has the same effect as that of the retainer 11 for electronic parts shown in FIG. 4.

Although, in the above-described embodiments, the retaining hole for chip-type electronic parts is formed as a through hole, a retaining hole having a bottom may also be formed.

Furthermore, the plane shapes of the elastic retainer plate and the retaining hole are not limited to those illustrated. It is needless to say that the plane shapes can be suitably altered depending on the plane shape of the electronic part to be contained, structure of apparatus on which the retainer is to be mounted, a place where the retainer is to be stored, or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A retainer for chip-type electronic parts, comprising
   a frame made substantially of rigid material and having a plurality of interior openings defining respective inner walls;
   a plurality of respective retainer plate means disposed within said interior openings and having outer edges fixed to said inner walls;
   each said retainer plate means comprising an elastic retainer plate having a plurality of retaining holes formed therein, said retaining holes being sized for receiving said chip-type electronic parts, and having inner surfaces which exert an elastic retaining force on said chip-type electronic parts held therein;
   each said elastic retainer plate being made substantially completely of elastic material, and having substantially only such elastic material interposed between said retaining holes.

2. The retainer for chip-type electronic parts according to claim 1, wherein the size of each of said retaining holes is smaller than that of an external form of the chip-type electronic parts.

3. The retainer for chip-type electronic parts according to claim 1, wherein said elastic retainer plate is formed of rubber.

4. The retainer for chip-type electronic parts according to claim 1, wherein said elastic retainer plate is formed of synthetic resins having elasticity.

* * * * *